United States Patent
Dai

(10) Patent No.: US 9,576,677 B2
(45) Date of Patent: Feb. 21, 2017

(54) SCAN DRIVING CIRCUIT

(71) Applicant: SHENZHEN CHINA STAR OPTOELECTRONICS TECHNOLOGY CO., LTD., Shenzhen, Guangdong (CN)

(72) Inventor: Chao Dai, Shenzhen (CN)

(73) Assignee: SHENZHEN TECHNOLOGY STAR OPTOELECTRONICS TECHNOLOGY CO., LTD., Shenzhen, Guangdong (*) Notice: Subject to any disclaimer, the term of this patent is extended or adjusted under 35 U.S.C. 154(b) by 32 days.

(21) Appl. No.: 14/417,237

(22) PCT Filed: Dec. 19, 2014

(86) PCT No.: PCT/CN2014/094316
§ 371 (c)(1),
(2) Date: Jan. 26, 2015

(87) PCT Pub. No.: WO2016/090671
PCT Pub. Date: Jun. 16, 2016

(65) Prior Publication Data
US 2016/0171949 A1    Jun. 16, 2016

(30) Foreign Application Priority Data
Dec. 12, 2014 (CN) .......................... 2014 1 0766636

(51) Int. Cl.
G09G 3/36        (2006.01)
G11C 19/00      (2006.01)

(52) U.S. Cl.
CPC ............ *G11C 19/00* (2013.01); *G09G 3/3677* (2013.01); *G09G 2310/0286* (2013.01); *G09G 2310/08* (2013.01)

(58) Field of Classification Search
CPC ............... G09G 3/285; G09G 3/3674–3/3681; G09G 2310/02–2310/0221; G09G 2310/0264–2310/0297
See application file for complete search history.

(56) References Cited

U.S. PATENT DOCUMENTS

2012/0105398 A1* 5/2012 Park ................. H03K 19/01852
345/206
2013/0335665 A1* 12/2013 Tseng ................. G02F 1/13306
349/43
2015/0318051 A1* 11/2015 Hong ..................... G11C 19/28
377/68

* cited by examiner

Primary Examiner — Sanghyuk Park

(57) ABSTRACT

A scan driving circuit is disclosed, and the scan driving circuit has a pull-up control module, a pull-up module, a pull-down module, a pull-down maintaining module, a down-stream module and a bootstrap capacitor; when the pull-up control module generates a scan level signal, the pull-up control module and the pull-down maintaining module use a constant high-level voltage to avoid an electrical leakage phenomenon; and the pull down module uses a present-level scan signal to avoid the electrical leakage phenomenon. Thus, the electrical leakage phenomenon can be efficiently avoided.

18 Claims, 6 Drawing Sheets

SCAN DRIVING CIRCUIT

FIELD OF THE INVENTION

The present invention relates to a field of display driving, and more particularly to a scan driving circuit.

BACKGROUND OF THE INVENTION

A gate driver on array (GOA) generates a scan driver circuit on an existing array substrate of a thin film transistor liquid crystal display (TFT-LCD), in order to implement a driving method which progressively scans for scan lines. A structural diagram of an existing scan driving circuit is illustrated in FIG. 1, and the scan driving circuit 10 includes a pull-up control module 101, a pull-up module 102, a down-stream module 103, a pull-down module 104, a bootstrap capacitor 105, and a pull-down maintaining module 106.

When the scan driving circuit 10 works in a high-temperature state, a threshold voltage of a switch transistor moves to a negative value, so as to lead the switch transistor of each module of the scan driving circuit 10 to easily have an electrical leakage phenomenon, which affects the reliability of the scan driving circuit.

As a result, it is necessary to provide a scan driving circuit to solve the phenomenon existing in the conventional technologies.

SUMMARY OF THE INVENTION

A primary object of the present invention is to provide a scan driving circuit that has a smaller electrical leakage phenomenon and a higher reliability, which solves the easily occurring electrical leakage phenomenon of the existing scan driving circuit, which affects the reliability of the scan driving circuit.

To solve the above problem, the technical solution of the present invention is as follows:

A scan driving circuit is provided in an embodiment of the present invention, the scan driving circuit is used to execute a driving operation for cascaded scan lines, and comprises:

a pull-up control module receiving a previous-level down-stream signal, and generating a scan level signal corresponding to one of the scan lines according to the previous-level down-stream signal;

a pull-up module pulling up a scan signal of the corresponding scan line according to the scan level signal and a present-level clock signal;

a pull-down module pulling down a scan signal of the corresponding scan line according to a next-two-level clock signal and a next-two-level scan signal;

a pull-down maintaining module keeping the scan signal of the corresponding scan line in a low-level, and comprising a first pull-down maintaining unit and a second pull-down maintaining unit, wherein the first pull-down maintaining unit and the second pull-down maintaining unit work alternately;

a down-stream module transmitting a present-level down-stream signal to a next-level pull-up control module; and a bootstrap capacitor generating a high-level of the scan signal of the scan line;

wherein when the pull-up control module generates a scan level signal, the pull-up control module and the pull-down maintaining module use a constant high-level voltage to avoid an electrical leakage phenomenon; and the pull down module uses a present-level scan signal to avoid the electrical leakage phenomenon;

wherein the pull-up control module comprises a first switch transistor, a control end of the first switch transistor inputs the previous-level down-stream signal, an input end of the first switch transistor inputs the constant high-level voltage, and an output end of the first switch transistor is connected to the pull-up module, the pull-down module, the pull-down maintaining module, the down-stream module and the bootstrap capacitor.

In the scan driving circuit of the present invention, the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

In the scan driving circuit of the present invention, the down-stream module comprises a third switch transistor, a control end of the third switch transistor is connected to the output end of the first switch transistor of the pull-up control module, an input end of the third switch transistor inputs the present-level clock signal, and an output end of the third switch transistor outputs the present-level down-stream signal.

In the scan driving circuit of the present invention, the pull-down module comprises a fourth switch transistor and a fifth switch transistor, a control end of the fourth switch transistor inputs the next-two-level scan signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level clock signal, and an output end of the fifth switch transistor inputs the present-level scan signal.

In the scan driving circuit of the present invention, the pull-down maintaining module comprises a sixth switch transistor, a seventh switch transistor, an eight switch transistor, a ninth switch transistor, a tenth switch transistor, a eleventh switch transistor, a twelfth switch transistor, a thirteenth switch transistor, a fourteenth switch transistor and a fifteenth switch transistor;

wherein a control end of the sixth switch transistor inputs the constant high-level voltage, an input end of the sixth switch transistor inputs the constant high-level voltage, and an output end of the sixth switch transistor is connected to an output end of the seventh switch transistor, a control end of the eighth switch transistor and a control end of the tenth switch transistor respectively;

wherein a control end of the seventh switch transistor is connected to the output end of the first switch transistor and a control end of the eleventh switch transistor, and an input end of the seventh switch transistor is connected to a first constant low-level voltage;

wherein an input end of the eighth switch transistor inputs the constant high-level voltage, an output end of the eighth switch transistor is connected to an output end of the ninth switch transistor, a control end of the fourteenth switch transistor and a control end of the fifteenth switch transistor;

wherein a control end of the ninth switch transistor is connected to the output end of the first switch transistor, and an input end of the ninth switch transistor is connected to an output end of the tenth switch transistor and an output end of the eleventh switch transistor;

wherein an input end of the tenth switch transistor inputs the constant high-level voltage;

wherein an input end of the eleventh switch transistor is connected to a second constant low-level voltage;

wherein a control end of the twelfth switch transistor is connected to the output end of the first switch transistor, an input end of the twelfth switch transistor inputs the constant high-level voltage, and an input end of the twelfth switch transistor is connected to an output end of a thirteenth switch transistor and an output end of the fourteenth switch transistor respectively;

wherein a control end of the thirteenth switch transistor is connected to a control end of the fifteenth switch transistor, and an input end of the thirteenth switch transistor is connected to the second constant low-level voltage;

wherein an input end of the fourteenth switch transistor is connected to the output end of the first switch transistor;

wherein an input end of the fifteenth switch transistor is connected to the first constant low-level voltage, and an output end of the fifteenth switch transistor is connected to the output end of the second switch transistor of the pull-up control module.

In the scan driving circuit of the present invention, the first constant low-level voltage is greater than the second constant low-level voltage.

In the scan driving circuit of the present invention, the bootstrap capacitor is configured between the output end of the first switch transistor and an output end of a second switch transistor of the pull-up module.

In the scan driving circuit of the present invention, the pull-down module comprises a fourth switch transistor and a fifth switch transistor, a control end of the fourth switch transistor inputs the next-two-level clock signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level scan signal, and an output end of the fifth switch transistor inputs the present-level scan signal.

A scan driving circuit is provided in an embodiment of the present invention, the scan driving circuit is used to execute a driving operation for cascaded scan lines, and comprises:

a pull-up control module receiving a previous-level down-stream signal, and generating a scan level signal corresponding to one of the scan lines according to the previous-level down-stream signal;

a pull-up module pulling up a scan signal of the corresponding scan line according to the scan level signal and a present-level clock signal;

a pull-down module pulling down a scan signal of the corresponding scan line according to a next-two-level clock signal and a next-two-level scan signal;

a pull-down maintaining module keeping the scan signal of the corresponding scan line in a low-level;

a down-stream module transmitting a present-level down-stream signal to a next-level pull-up control module; and a bootstrap capacitor generating a high-level of the scan signal of the scan line;

wherein when the pull-up control module generates a scan level signal, the pull-up control module and the pull-down maintaining module use a constant high-level voltage to avoid an electrical leakage phenomenon; and the pull down module uses a present-level scan signal to avoid the electrical leakage phenomenon.

In the scan driving circuit of the present invention, the pull-up control module comprises a first switch transistor, a control end of the first switch transistor inputs the previous-level down-stream signal, an input end of the first switch transistor inputs the constant high-level voltage, and an output end of the first switch transistor is connected to the pull-up module, the pull-down module, the pull-down maintaining module, the down-stream module and the bootstrap capacitor respectively.

In the scan driving circuit of the present invention, the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

In the scan driving circuit of the present invention, the down-stream module comprises a third switch transistor, a control end of the third switch transistor is connected to the output end of the first switch transistor of the pull-up control module, an input end of the third switch transistor inputs the present-level clock signal, and an output end of the third switch transistor outputs the present-level down-stream signal.

In the scan driving circuit of the present invention, the pull-down module comprises a fourth switch transistor and a fifth switch transistor, a control end of the fourth switch transistor inputs the next-two-level scan signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level clock signal, and an output end of the fifth switch transistor inputs the present-level scan signal.

In the scan driving circuit of the present invention, the pull-down maintaining module comprises a sixth switch transistor, a seventh switch transistor, an eight switch transistor, a ninth switch transistor, a tenth switch transistor, a eleventh switch transistor, a twelfth switch transistor, a thirteenth switch transistor, a fourteenth switch transistor and a fifteenth switch transistor;

wherein a control end of the sixth switch transistor inputs the constant high-level voltage, an input end of the sixth switch transistor inputs the constant high-level voltage, an output end of the sixth switch transistor is connected to an output end of the seventh switch transistor, a control end of the eighth switch transistor and a control end of the tenth switch transistor respectively;

wherein a control end of the seventh switch transistor is connected to the output end of the first switch transistor and a control end of the eleventh switch transistor, an input end of the seventh switch transistor is connected to a first constant low-level voltage;

wherein an input end of the eighth switch transistor inputs the constant high-level voltage, an output end of the eighth switch transistor is connected to an output end of the ninth switch transistor, a control end of the fourteenth switch transistor and a control end of the fifteenth switch transistor;

wherein a control end of the ninth switch transistor is connected to the output end of the first switch transistor, an input end of the ninth switch transistor is connected to an output end of the tenth switch transistor and an output end of the eleventh switch transistor;

wherein an input end of the tenth switch transistor inputs the constant high-level voltage;

wherein an input end of the eleventh switch transistor is connected to a second constant low-level voltage;

wherein a control end of the twelfth switch transistor is connected to the output end of the first switch transistor, an input end of the twelfth switch transistor inputs the constant high-level voltage, and an input end of the twelfth switch transistor is connected to an output end of a thirteenth switch transistor and an output end of the fourteenth switch transistor respectively;

wherein a control end of the thirteenth switch transistor is connected to a control end of the fifteenth switch transistor, and an input end of the thirteenth switch transistor is connected to the second constant low-level voltage;

wherein an input end of the fourteenth switch transistor is connected to the output end of the first switch transistor;

wherein an input end of the fifteenth switch transistor is connected to the first constant low-level voltage, and an output end of the fifteenth switch transistor is connected to the output end of the second switch transistor of the pull-up control module.

In the scan driving circuit of the present invention, the first constant low-level voltage is greater than the second constant low-level voltage.

In the scan driving circuit of the present invention, the bootstrap capacitor is configured between the output end of the first switch transistor and an output end of a second switch transistor of the pull-up module.

In the scan driving circuit of the present invention, the pull-down module comprises a fourth switch transistor and a fifth switch transistor, a control end of the fourth switch transistor inputs the next-two-level clock signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level scan signal, and an output end of the fifth switch transistor inputs the present-level scan signal.

In the scan driving circuit of the present invention, the pull-down maintaining module comprises a first pull-down maintaining unit and a second pull-down maintaining unit, and the first pull-down maintaining unit and the second pull-down maintaining unit work alternately.

In contrast to an existing scan driving circuit, through setting a pull-up control module, a pull-down maintaining module and a pull-down module, the scan driving circuit of the present invention can avoid an electrical leakage phenomenon successfully so as to improve the reliability of a scan driving circuit; the present invention solves the easily occurring electrical leakage phenomenon of the existing scan driving circuit, which affects the reliability of the scan driving circuit.

To allow the above description of the present invention to be more clear and comprehensive, there are preferred embodiments with the accompanying figures described in detail below.

DETAILED DESCRIPTION OF THE PREFERRED EMBODIMENTS

Figure 1:
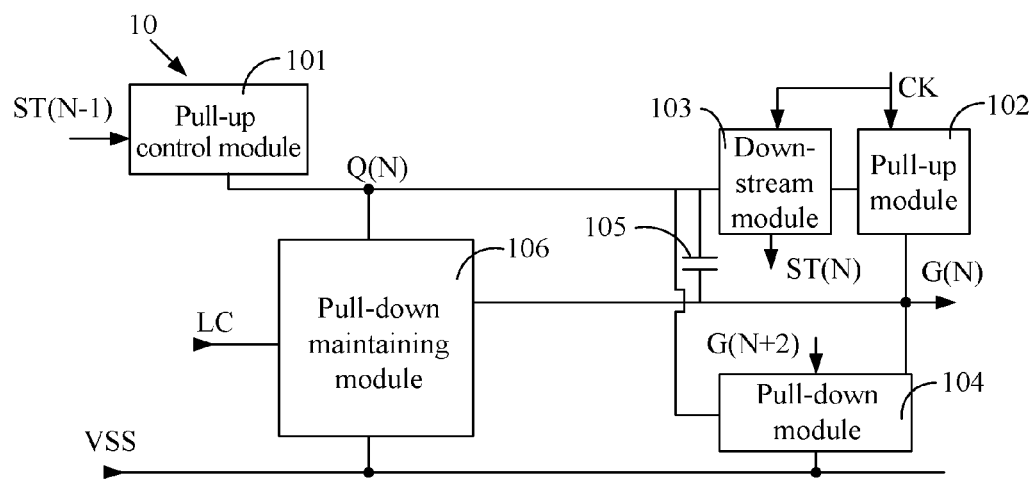
FIG. 1 is a structural diagram of an existing scan driving circuit.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In the drawings, units with similar structures are represented with the same label.

Figure 2:
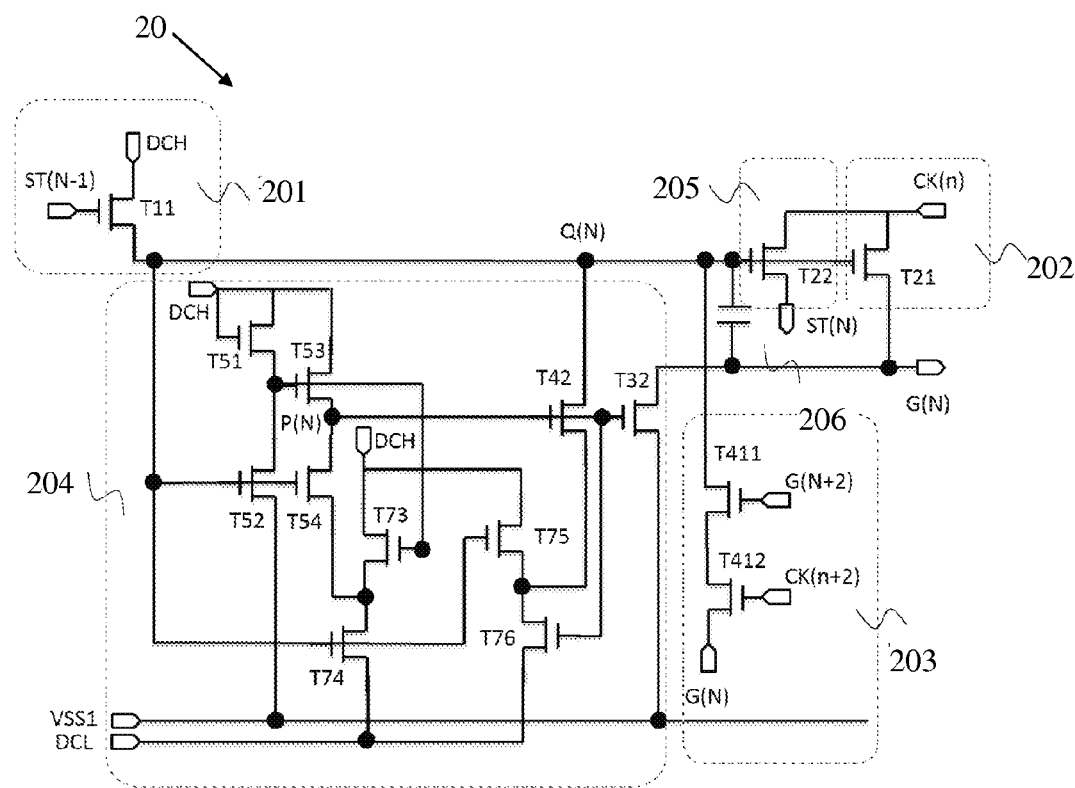
FIG. 2 is a structural diagram of a scan driving circuit according to the first preferred embodiment of the present invention.

Refer to FIG. 2, which is a structural diagram of a scan driving circuit according to the first preferred embodiment of the present invention. The scan driving circuit 20 of the present preferred embodiment includes a pull-up control module 201, a pull-up module 202, a pull-down module 203, a pull-down maintaining module 204, a down-stream module 205, and a bootstrap capacitor 206. The pull-up control module 201 is used to receive a previous-level down-stream signal ST(N−1) and generate a scan level signal Q(N) corresponding to one of the scan lines according to the previous-level down-stream signal ST(N−1); the pull-up module 202 is used to pull up a scan signal G(N) of the corresponding scan line according to the scan level signal Q(N) and a present-level clock signal CK(n); the pull-down module 203 is used to pull down a scan signal G(N) of the corresponding scan line according to a next-two-level clock signal CK(n+2) and a next-two-level scan signal G(N+2); the pull-down maintaining module 204 is used to keep the scan signal G(N) of the corresponding scan line in a low-level; the down-stream module 205 is used to transmit a present-level down-stream signal ST(N) to a next-level pull-up control module; the bootstrap capacitor 206 is used to generate a high-level of the scan signal G(N) of the scan line.

The pull-up control module 201 comprises a first switch transistor T11; a control end of the first switch transistor T11 inputs the previous-level down-stream signal ST(N−1), an input end of the first switch transistor T11 inputs the constant high-level voltage DCH, and an output end of the first switch transistor T11 is connected to the pull-up module 202, the pull-down module 203, the pull-down maintaining module 204, the down-stream module 205 and the bootstrap capacitor 206.

The pull-up module 202 comprises a second switch transistor T21; a control end of the second switch transistor T21 is connected to the output end of the first switch transistor T11 of the pull-up control module, an input end of the second switch transistor T21 inputs the present-level clock signal CK(n), and an output end of the second switch transistor T21 outputs a present-level scan signal G(N).

The down-stream module comprises a third switch transistor T22; a control end of the third switch transistor T22 is connected to the output end of the first switch transistor T11 of the pull-up control module 201, an input end of the third switch transistor T22 inputs the present-level clock signal CK(n), and an output end of the third switch transistor T22 outputs the present-level down-stream signal ST(N).

The pull-down module 203 comprises a fourth switch transistor T411 and a fifth switch transistor T412; a control end of the fourth switch transistor T411 inputs the next-two-level scan signal G(N+2), an input end of the fourth switch transistor T411 is connected to the output end of the first switch transistor T11 of the pull-up control module, the input end of the fourth switch transistor T411 is connected to an input end of the fifth switch transistor T412, a control end of the fifth switch transistor T412 inputs the next-two-level clock signal CK(n+2), and an output end of the fifth switch transistor T412 inputs the present-level scan signal G(N).

The pull-down maintaining module 204 comprises a sixth switch transistor T51, a seventh switch transistor T52, an eight switch transistor T53, a ninth switch transistor T54, a tenth switch transistor T73, a eleventh switch transistor T74, a twelfth switch transistor T75, a thirteenth switch transistor T76, a fourteenth switch transistor T42 and a fifteenth switch transistor T32.

A control end of the sixth switch transistor T51 inputs the constant high-level voltage DCH, an input end of the sixth switch transistor T51 inputs the constant high-level voltage, and an output end of the sixth switch transistor T51 is connected to an output end of the seventh switch transistor T52, a control end of the eighth switch transistor T53 and a control end of the tenth switch transistor T73 respectively.

A control end of the seventh switch transistor T52 is connected to the output end of the first switch transistor T11 and a control end of the eleventh switch transistor T74, and an input end of the seventh switch transistor T52 is connected to a first constant low-level voltage VSS1.

An input end of the eighth switch transistor T53 inputs the constant high-level voltage DCH, an output end of the eighth switch transistor T53 is connected to an output end of the ninth switch transistor T54, a control end of the fourteenth switch transistor T42 and a control end of the fifteenth switch transistor T32.

A control end of the ninth switch transistor T54 is connected to the output end of the first switch transistor T11, and an input end of the ninth switch transistor T54 is connected to an output end of the tenth switch transistor T73 and an output end of the eleventh switch transistor T74.

An input end of the tenth switch transistor T73 inputs the constant high-level voltage DCH; an input end of the eleventh switch transistor T74 is connected to a second constant low-level voltage DCL.

A control end of the twelfth switch transistor T75 is connected to the output end of the first switch transistor T11, an input end of the twelfth switch transistor T75 inputs the constant high-level voltage DCH, and an input end of the twelfth switch transistor T75 is connected to an output end of a thirteenth switch transistor T76 and an output end of the fourteenth switch transistor T42 respectively.

A control end of the thirteenth switch transistor T76 is connected to a control end of the fifteenth switch transistor T32, and an input end of the thirteenth switch transistor T76 is connected to the second constant low-level voltage DCL.

An input end of the fourteenth switch transistor T42 is connected to the output end of the first switch transistor T11.

An input end of the fifteenth switch transistor T32 is connected to the first constant low-level voltage VSS1, and an output end of the fifteenth switch transistor T32 is connected to the output end of the second switch transistor T21 of the pull-up control module 202.

The bootstrap capacitor 206 is configured between the output end of the first switch transistor T11 and an output end of a second switch transistor T21 of the pull-up module 202.

Figure 3:
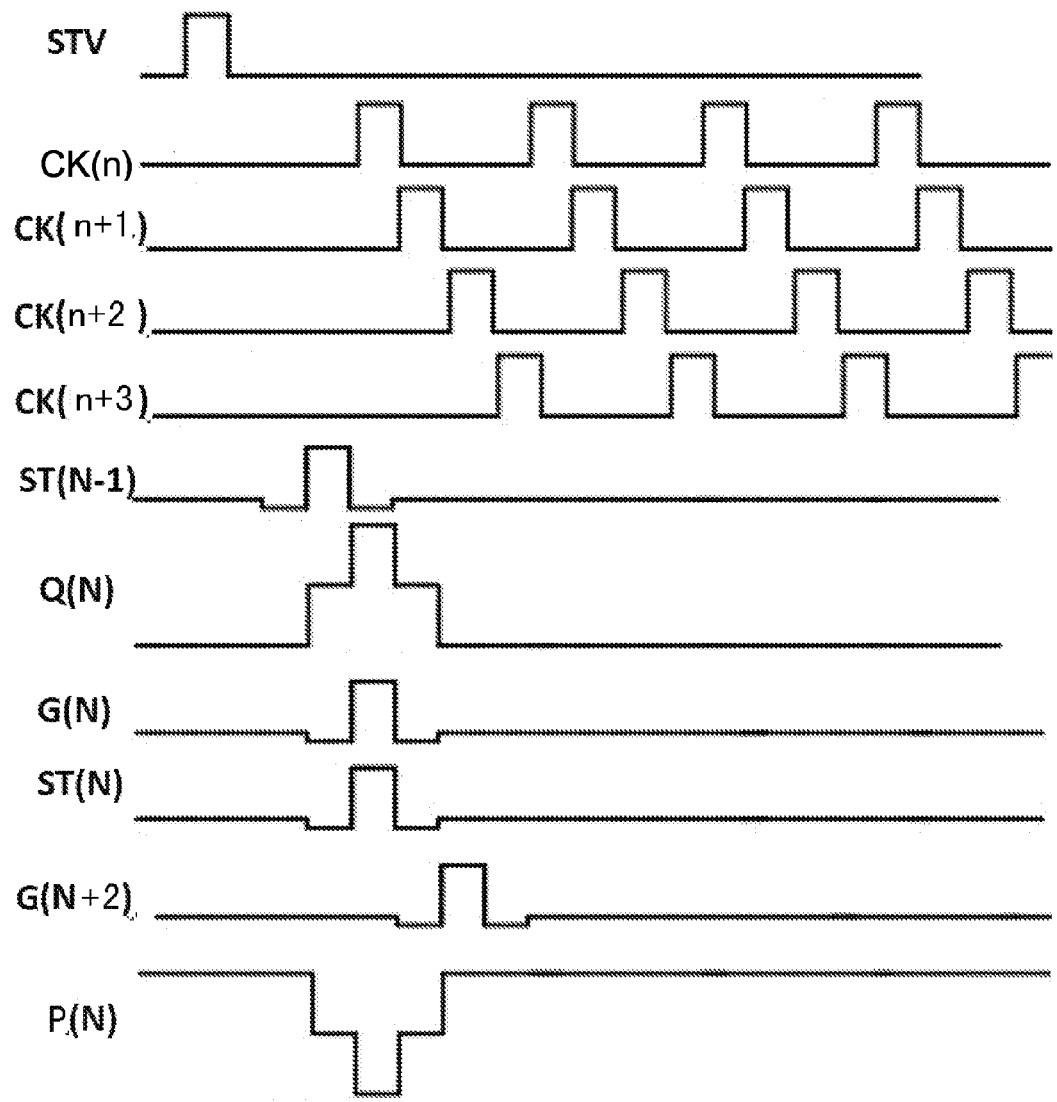
FIG. 3 is a signal waveform diagram of a scan driving circuit according to the first preferred embodiment of the present invention.

Referring to FIG. 2 and FIG. 3, FIG. 3 is a signal waveform diagram of a scan driving circuit according to the first preferred embodiment of the present invention. When the scan driving circuit of the present preferred embodiment is in a working state, a starting signal STV starts the scan driving circuit. When the previous-level down-stream signal ST(N−1) is a high-level, the first switch transistor T11 is turned on, and the constant high-level voltage DCH charges for the bootstrap capacitor 206 through the first switch transistor T11 so as to improve a reference point Q(N) to a higher level. Then, the previous-level down-stream signal ST(N−1) is turned into a low-level, and the first switch transistor T11 is turned off. The reference point Q(N) is kept in a higher level through the bootstrap capacitor 206, and the second switch transistor T21 and the third switch transistor T22 are turned on.

Hereafter, the present-level clock signal CK(n) is turned into a high-level. The clock signal CK(n) charges for the bootstrap capacitor 206 through the second switch transistor continually, so as to let the reference point Q(N) achieve a higher level, and the present-level scan signal G(N) and the present-level down-stream signal ST(N) are also turned into a high-level.

At this time, the reference point Q(N) is in high-level state. Since the input end of the first switch transistor T11 is connected to the constant high-level voltage DCH, the reference point Q(N) does not generate an electrical leakage phenomenon through the first switch transistor T11.

At the same time, due to the seventh switch transistor T52, the ninth switch transistor T54, the eleventh switch transistor T74 and the twelfth switch transistor T75 being turned on, a reference point P(N) is in a low-level state, so that the fourteenth switch transistor T42 is turned off. The constant high-level voltage DCH is connected to the output end of the fourteenth switch transistor through the twelfth switch transistor, so that the reference point Q(N) also does not generate an electrical leakage phenomenon through the fourteenth switch transistor T42.

At the same time, the fourth switch transistor T411 and the fifth switch transistor T412 are turned off. However, the output end of the fifth switch transistor T412 inputs the present-level scan signal G(N), the present-level scan signal G(N) is in a high-level state at this time. Therefore, the reference point Q(N) also does not generate an electrical leakage phenomenon through the fourth switch transistor T411 and the fifth switch transistor T412.

In summary, when the scan driving circuit 20 of the present preferred embodiment is in a high-level state, the scan driving circuit 20 does not generate an electrical leakage phenomenon through the first switch transistor, T11, the fourteenth switch transistor, the fourth switch transistor, and the fifth switch transistor, which improves the reliability of the scan driving circuit 20.

When the next-two-level scan signal G(N+2) and the next-two-level clock signal CK(n+2) are in a high level, the fourth switch transistor and the fifth switch transistor are turned on; at the same time, the present-level scan signal G(N) is in a low-level, and the reference point Q(N) discharges through the pull-down module. Since the seventh switch transistor T52 is turned off, the reference point P(N) is turned into a high-level through the sixth switch transistor and the eighth switch transistor; at this time, the thirteenth switch transistor T76 and the fourteenth switch transistor T42 are turned on, and the reference point Q(N) is connected to the second constant low-level voltage DCL through the fourth switch transistor T42 and the thirteenth switch transistor T76, which ensures that the reference point Q(N) is in a low potential and keeps the present-level scan signal G(N) in a low-level.

To analyze the driving circuit conveniently, the first constant low-level voltage VSS1 is set to be greater than the second constant low-level voltage DCL so as to control each part of the driving circuit independently. A specific value of the first constant low-level voltage VSS1 or the second constant low-level voltage DCL are set up according to the actual situation.

Through setting a pull-up control module, a pull-down maintaining module and a pull-down module, the present invention can avoid an electrical leakage phenomenon successfully so as to improve the reliability of a scan driving circuit.

Figure 4:
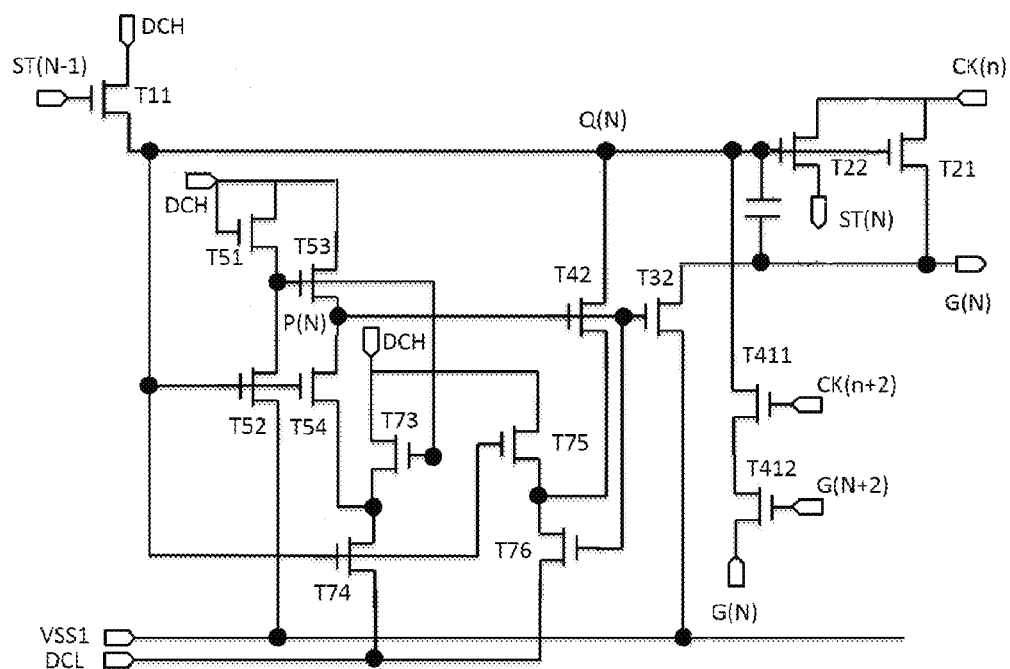
FIG. 4 is a structural diagram of a scan driving circuit according to the second preferred embodiment of the present invention.

Refer to FIG. 4, which is a structural diagram of a scan driving circuit according to the second preferred embodiment of the present invention. A difference between the scan driving circuit of the present preferred embodiment and the first preferred embodiment is that: a control end of the fourth switch transistor T411 of the pull-down module inputs the next-two-level clock signal CK(n+2), an input end of the fourth switch transistor T411 is connected to the output end of the first switch transistor T11 of the pull-up control module, an output end of the fourth switch transistor T411 is connected to an input end of the fifth switch transistor T412, a control end of the fifth switch transistor T412 inputs the next-two-level scan signal G(N+2), and an output end of the fifth switch transistor T412 inputs the present-level scan signal G(N).

In the present preferred embodiment, the scan driving circuit of the first preferred embodiment is modified, which not only avoids the electrical leakage phenomenon of the reference point Q(N) through the fourth switch transistor and the fifth switch transistor, but also avoids an impulse signal of the next-two-level clock signal affecting the present-level scan signal.

Figure 5:
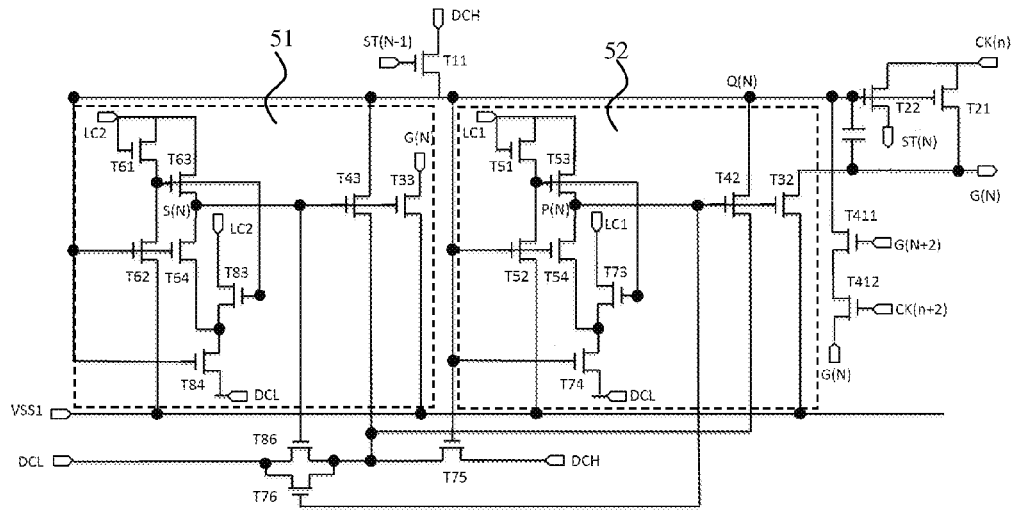
FIG. 5 is a structural diagram of a scan driving circuit according to the third preferred embodiment of the present invention.

Refer to FIG. 5, which is a structural diagram of a scan driving circuit according to the third preferred embodiment of the present invention. On the basis of the first preferred embodiment, the pull-down maintaining module of the scan driving circuit of the present preferred embodiment comprises a first pull-down maintaining unit 51 and a second pull-down maintaining unit 52, and the first pull-down maintaining unit 51 and the second pull-down maintaining unit 52 work alternately. The pull-down maintaining module controls the pull-down maintaining units through voltage sources LC1 AND LC2 respectively. The working principles of the first pull-down maintaining unit 51 and the second pull-down maintaining unit 52 are the same as the pull-down maintaining module of the first preferred embodiment. Please refer to the related descriptions of the scan driving circuit of the first preferred embodiment.

Two pull-down maintaining units which work alternately are configured in the scan driving circuit of the present preferred embodiment, which reduces the electrical stress of each pull-down maintaining unit efficiently and further improves the reliability of a scan driving circuit with long working hours.

Figure 6:
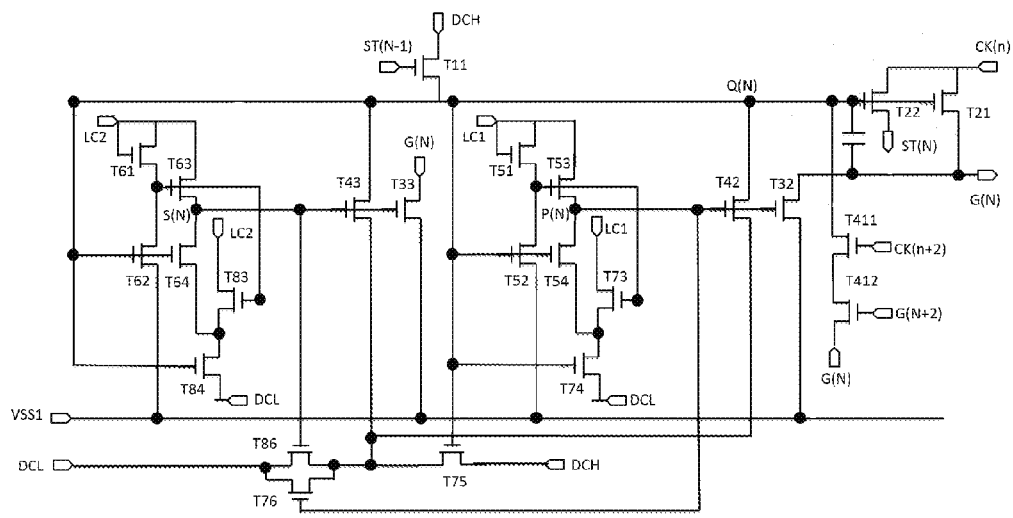
FIG. 6 is a structural diagram of a scan driving circuit according to the fourth preferred embodiment of the present invention.

Refer to FIG. 6, which is a structural diagram of a scan driving circuit according to the fourth preferred embodiment of the present invention. A difference between the scan driving circuit of the present preferred embodiment and the third preferred embodiment is that: a control end of the fourth switch transistor T411 of the pull-down module inputs the next-two-level clock signal CK(n+2), an input end of the fourth switch transistor T411 is connected to the output end of the first switch transistor T11 of the pull-up control module, an output end of the fourth switch transistor T411 is connected to an input end of the fifth switch transistor T412, a control end of the fifth switch transistor T412 inputs the next-two-level scan signal G(N+2), and an output end of the fifth switch transistor T412 inputs the present-level scan signal G(N).

In the present preferred embodiment, the scan driving circuit of the third preferred embodiment is modified, which not only avoids the electrical leakage phenomenon of the reference point Q(N) through the fourth switch transistor and the fifth switch transistor, but also avoids an impulse signal of the next-two-level clock signal affecting the present-level scan signal.

Figure 7:
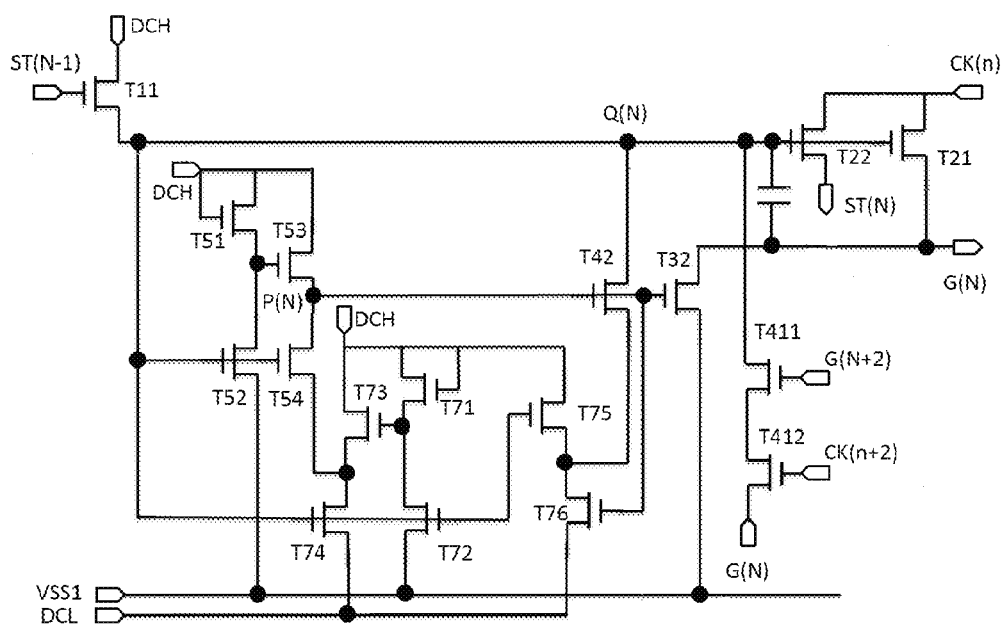
FIG. 7 is a structural diagram of a scan driving circuit according to the fifth preferred embodiment of the present invention.

Refer to FIG. 7, which is a structural diagram of a scan driving circuit according to the fifth preferred embodiment of the present invention. A difference between the scan driving circuit of the present preferred embodiment and the first preferred embodiment is that: the scan driving circuit of the present preferred embodiment does not share nodes (there are no sharing nodes of the control end of T53, and no sharing nodes of the control end of T73). Some control units are added; however, this further improves the reliability of the scan driving circuit of the present invention.

Through setting a pull-up control module, a pull-down maintaining module and a pull-down module, a scan driving circuit of the present invention can avoid an electrical leakage phenomenon successfully so as to improve the reliability of a scan driving circuit; the present invention solves the easily occurring electrical leakage phenomenon of the existing scan driving circuit, which affects the reliability of the scan driving circuit.

In summary, the present invention has been disclosed with preferred embodiments thereof, but the above described preferred embodiments are not intended to limit the present invention. Those who are skilled in the art can make many changes and modifications to the described embodiment which can be carried out without departing from the scope and the spirit of the invention that is intended to be limited only by the appended claims.

What is claimed is:

1. A scan driving circuit, executing a driving operation for cascaded scan lines, comprising:
   a pull-up control module receiving a previous-level downstream signal, and generating a scan level signal corresponding to one of the scan lines according to the previous-level down-stream signal;
   a pull-up module pulling up a scan signal of the corresponding scan line according to the scan level signal and a present-level clock signal;
   a pull-down module pulling down a scan signal of the corresponding scan line according to a next-two-level clock signal and a next-two-level scan signal;
   a pull-down maintaining module keeping the scan signal of the corresponding scan line in a low-level, and comprising a first pull-down maintaining unit and a second pull-down maintaining unit, wherein the first pull-down maintaining unit and the second pull-down maintaining unit work alternately;

a down-stream module transmitting a present-level downstream signal to a next-level pull-up control module; and a bootstrap capacitor generating a high-level of the scan signal of the scan line;

wherein when the pull-up control module generates a scan level signal, the pull-up control module and the pull-down maintaining module use a constant high-level voltage to avoid an electrical leakage phenomenon; and the pull down module uses a present-level scan signal to avoid the electrical leakage phenomenon;

wherein the pull-up control module comprises a first switch transistor, a control end of the first switch transistor inputs the previous-level down-stream signal, an input end of the first switch transistor inputs the constant high-level voltage, and an output end of the first switch transistor is connected to the pull-up module, the pull-down module, the pull-down maintaining module, the down-stream module and the bootstrap capacitor.

2. The scan driving circuit according to claim 1, wherein the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

3. The scan driving circuit according to claim 1, wherein the down-stream module comprises a third switch transistor, a control end of the third switch transistor is connected to the output end of the first switch transistor of the pull-up control module, an input end of the third switch transistor inputs the present-level clock signal, and an output end of the third switch transistor outputs the present-level down-stream signal.

4. The scan driving circuit according to claim 1, wherein the pull-down module comprises a fourth switch transistor and a fifth switch transistor, a control end of the fourth switch transistor inputs the next-two-level scan signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level clock signal, and an output end of the fifth switch transistor inputs the present-level scan signal.

5. The scan driving circuit according to claim 1, wherein the pull-down maintaining module comprises a sixth switch transistor, a seventh switch transistor, an eight switch transistor, a ninth switch transistor, a tenth switch transistor, a eleventh switch transistor, a twelfth switch transistor, a thirteenth switch transistor, a fourteenth switch transistor and a fifteenth switch transistor;

wherein a control end of the sixth switch transistor inputs the constant high-level voltage, an input end of the sixth switch transistor inputs the constant high-level voltage, and an output end of the sixth switch transistor is connected to an output end of the seventh switch transistor, a control end of the eighth switch transistor and a control end of the tenth switch transistor respectively;

wherein a control end of the seventh switch transistor is connected to the output end of the first switch transistor and a control end of the eleventh switch transistor, and an input end of the seventh switch transistor is connected to a first constant low-level voltage;

wherein an input end of the eighth switch transistor inputs the constant high-level voltage, an output end of the eighth switch transistor is connected to an output end of the ninth switch transistor, a control end of the fourteenth switch transistor and a control end of the fifteenth switch transistor;

wherein a control end of the ninth switch transistor is connected to the output end of the first switch transistor, and an input end of the ninth switch transistor is connected to an output end of the tenth switch transistor and an output end of the eleventh switch transistor;

wherein an input end of the tenth switch transistor inputs the constant high-level voltage;

wherein an input end of the eleventh switch transistor is connected to a second constant low-level voltage;

wherein a control end of the twelfth switch transistor is connected to the output end of the first switch transistor, an input end of the twelfth switch transistor inputs the constant high-level voltage, and an input end of the twelfth switch transistor is connected to an output end of a thirteenth switch transistor and an output end of the fourteenth switch transistor respectively;

wherein a control end of the thirteenth switch transistor is connected to a control end of the fifteenth switch transistor, and an input end of the thirteenth switch transistor is connected to the second constant low-level voltage;

wherein an input end of the fourteenth switch transistor is connected to the output end of the first switch transistor;

wherein an input end of the fifteenth switch transistor is connected to the first constant low-level voltage, and an output end of the fifteenth switch transistor is connected to the output end of the second switch transistor of the pull-up control module.

6. The scan driving circuit according to claim 5, wherein the first constant low-level voltage is greater than the second constant low-level voltage.

7. The scan driving circuit according to claim 1, wherein the bootstrap capacitor is configured between the output end of the first switch transistor and an output end of a second switch transistor of the pull-up module.

8. The scan driving circuit according to claim 1, wherein the pull-down module comprises a fourth switch transistor and a fifth switch transistor, a control end of the fourth switch transistor inputs the next-two-level clock signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level scan signal, and an output end of the fifth switch transistor inputs the present-level scan signal.

9. A scan driving circuit, executing a driving operation for cascaded scan lines, comprising:

a pull-up control module receiving a previous-level down-stream signal, and generating a scan level signal corresponding to one of the scan lines according to the previous-level down-stream signal;

a pull-up module pulling up a scan signal of the corresponding scan line according to the scan level signal and a present-level clock signal;

a pull-down module pulling down a scan signal of the corresponding scan line according to a next-two-level clock signal and a next-two-level scan signal;

a pull-down maintaining module keeping the scan signal of the corresponding scan line in a low-level;

a down-stream module transmitting a present-level down-stream signal to a next-level pull-up control module; and a bootstrap capacitor generating a high-level of the scan signal of the scan line;

wherein when the pull-up control module generates a scan level signal, the pull-up control module and the pull-down maintaining module use a constant high-level voltage to avoid an electrical leakage phenomenon; and the pull down module uses a present-level scan signal to avoid the electrical leakage phenomenon.

10. The scan driving circuit according to claim 9, wherein the pull-up control module comprises a first switch transistor, a control end of the first switch transistor inputs the previous-level down-stream signal, an input end of the first switch transistor inputs the constant high-level voltage, and an output end of the first switch transistor is connected to the pull-up module, the pull-down module, the pull-down maintaining module, the down-stream module and the bootstrap capacitor respectively.

11. The scan driving circuit according to claim 10, wherein the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

12. The scan driving circuit according to claim 10, wherein the down-stream module comprises a third switch transistor, a control end of the third switch transistor is connected to the output end of the first switch transistor of the pull-up control module, an input end of the third switch transistor inputs the present-level clock signal, and an output end of the third switch transistor outputs the present-level down-stream signal.

13. The scan driving circuit according to claim 10, wherein the pull-down module comprises a fourth switch transistor and a fifth switch transistor, a control end of the fourth switch transistor inputs the next-two-level scan signal, an input end of the fourth switch transistor is connected to the output end of the first switch transistor of the pull-up control module, an output end of the fourth switch transistor is connected to an input end of the fifth switch transistor, a control end of the fifth switch transistor inputs the next-two-level clock signal, and an output end of the fifth switch transistor inputs the present-level scan signal.

14. The scan driving circuit according to claim 10, wherein the pull-down maintaining module comprises a sixth switch transistor, a seventh switch transistor, an eight switch transistor, a ninth switch transistor, a tenth switch transistor, a eleventh switch transistor, a twelfth switch transistor, a thirteenth switch transistor, a fourteenth switch transistor and a fifteenth switch transistor;

wherein a control end of the sixth switch transistor inputs the constant high-level voltage, an input end of the sixth switch transistor inputs the constant high-level voltage, an output end of the sixth switch transistor is connected to an output end of the seventh switch transistor, a control end of the eighth switch transistor and a control end of the tenth switch transistor respectively;

wherein a control end of the seventh switch transistor is connected to the output end of the first switch transistor and a control end of the eleventh switch transistor, an input end of the seventh switch transistor is connected to a first constant low-level voltage;

wherein an input end of the eighth switch transistor inputs the constant high-level voltage, an output end of the eighth switch transistor is connected to an output end of the ninth switch transistor, a control end of the fourteenth switch transistor and a control end of the fifteenth switch transistor;

wherein a control end of the ninth switch transistor is connected to the output end of the first switch transistor, an input end of the ninth switch transistor is connected to an output end of the tenth switch transistor and an output end of the eleventh switch transistor;

wherein an input end of the tenth switch transistor inputs the constant high-level voltage;

wherein an input end of the eleventh switch transistor is connected to a second constant low-level voltage;

wherein a control end of the twelfth switch transistor is connected to the output end of the first switch transistor, an input end of the twelfth switch transistor inputs the constant high-level voltage, and an input end of the twelfth switch transistor is connected to an output end of a thirteenth switch transistor and an output end of the fourteenth switch transistor respectively;

wherein a control end of the thirteenth switch transistor is connected to a control end of the fifteenth switch transistor, and an input end of the thirteenth switch transistor is connected to the second constant low-level voltage;

wherein an input end of the fourteenth switch transistor is connected to the output end of the first switch transistor;

wherein an input end of the fifteenth switch transistor is connected to the first constant low-level voltage, and an output end of the fifteenth switch transistor is connected to the output end of the second switch transistor of the pull-up control module.

15. The scan driving circuit according to claim 14, wherein the first constant low-level voltage is greater than the second constant low-level voltage.

16. The scan driving circuit according to claim 10, wherein the bootstrap capacitor is configured between the output end of the first switch transistor and an output end of a second switch transistor of the pull-up module.

17. The scan driving circuit according to claim 10, wherein the pull-down module comprises a fourth switch transistor and a fifth switch transistor, a control end of the fourth switch transistor inputs the next-two-level clock signal, an input end of the fourth switch transistor is connected to the output end of the first switch transistor of the pull-up control module, and an output end of the fourth switch transistor is connected to an input end of the fifth switch transistor, a control end of the fifth switch transistor inputs the next-two-level scan signal and an output end of the fifth switch transistor inputs the present-level scan signal.

18. The scan driving circuit according to claim 9, wherein the pull-down maintaining module comprises a first pull-down maintaining unit and a second pull-down maintaining unit, and the first pull-down maintaining unit and the second pull-down maintaining unit work alternately.

* * * * *

UNITED STATES PATENT AND TRADEMARK OFFICE
CERTIFICATE OF CORRECTION

| | | |
|---|---|---|
| PATENT NO. | : 9,576,677 B2 | Page 1 of 1 |
| APPLICATION NO. | : 14/417237 | |
| DATED | : February 21, 2017 | |
| INVENTOR(S) | : Chao Dai | |

It is certified that error appears in the above-identified patent and that said Letters Patent is hereby corrected as shown below:

On the Title Page

Assignee (73):
Change "SHENZHEN CHINA OPTOELECTRONICS TECHNOLOGY CO., LTD., Shenzhen, (CN)"
To -- SHENZHEN CHINA STAR OPTOELECTRONICS TECHNOLOGY CO., LTD., Shenzhen, (CN) --

Signed and Sealed this
Thirtieth Day of April, 2019

Andrei Iancu
*Director of the United States Patent and Trademark Office*